United States Patent
Nguyen et al.

(10) Patent No.: US 7,235,484 B2
(45) Date of Patent: *Jun. 26, 2007

(54) NANOLAYER THICK FILM PROCESSING SYSTEM AND METHOD

(75) Inventors: Tue Nguyen, Fremont, CA (US); Tai Dung Nguyen, Fremont, CA (US)

(73) Assignee: Tegal Corporation, Petaluma, CA (US)

( * ) Notice: Subject to any disclaimer, the term of this patent is extended or adjusted under 35 U.S.C. 154(b) by 117 days.

This patent is subject to a terminal disclaimer.

(21) Appl. No.: 10/790,652

(22) Filed: Mar. 1, 2004

(65) Prior Publication Data
US 2004/0224505 A1    Nov. 11, 2004

Related U.S. Application Data

(63) Continuation of application No. 09/954,244, filed on Sep. 10, 2001, now Pat. No. 6,756,318.

(51) Int. Cl.
*H01L 21/44* (2006.01)
*H01L 21/31* (2006.01)

(52) U.S. Cl. ............... 438/680; 438/758; 257/E21.001

(58) Field of Classification Search .............. None
See application file for complete search history.

(56) References Cited

U.S. PATENT DOCUMENTS

| | | | | |
|---|---|---|---|---|
| 4,918,031 A | * | 4/1990 | Flamm et al. | 438/695 |
| 5,902,563 A | * | 5/1999 | Pinneo | 423/446 |
| 5,961,793 A | * | 10/1999 | Ngan | 204/192.12 |
| 6,613,656 B2 | * | 9/2003 | Li | 438/584 |
| 2002/0004293 A1 | * | 1/2002 | Soininen et al. | 438/584 |
| 2002/0170677 A1 | | 11/2002 | Tucker et al. | |

* cited by examiner

*Primary Examiner*—Scott B. Geyer
(74) *Attorney, Agent, or Firm*—Fliesler Meyer LLP

(57) ABSTRACT

A process to deposit a thin film by chemical vapor deposition includes evacuating a chamber of gases; exposing a device to a gaseous first reactant, wherein the first reactant deposits on the device to form the thin film having a plurality of monolayers in thickness; evacuating the chamber of gases; exposing the device, coated with the first reactant, to a gaseous second reactant under a plasma treatment, wherein the thin film is treated by the first reactant; and repeating the previous steps.

27 Claims, 14 Drawing Sheets

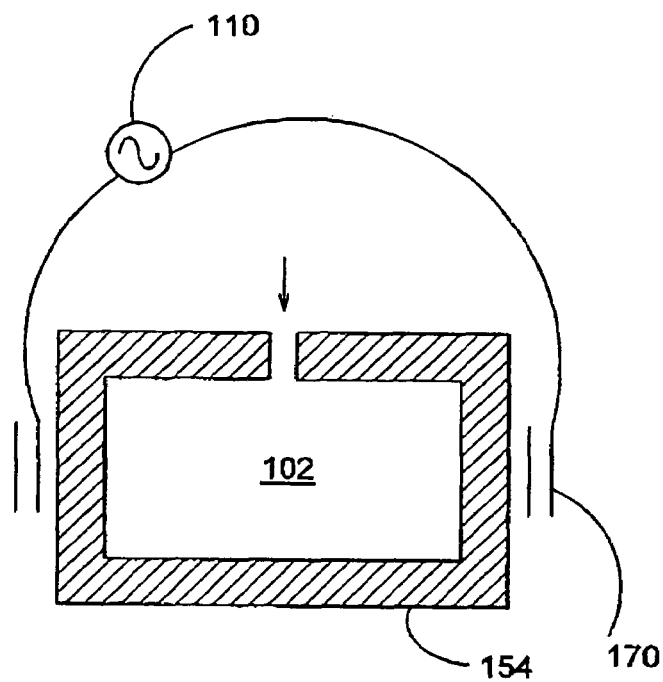
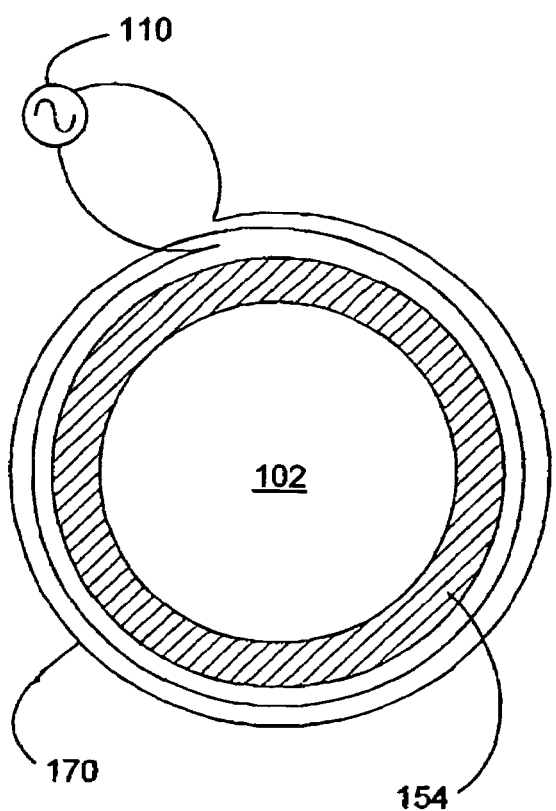
FIG. - 1D

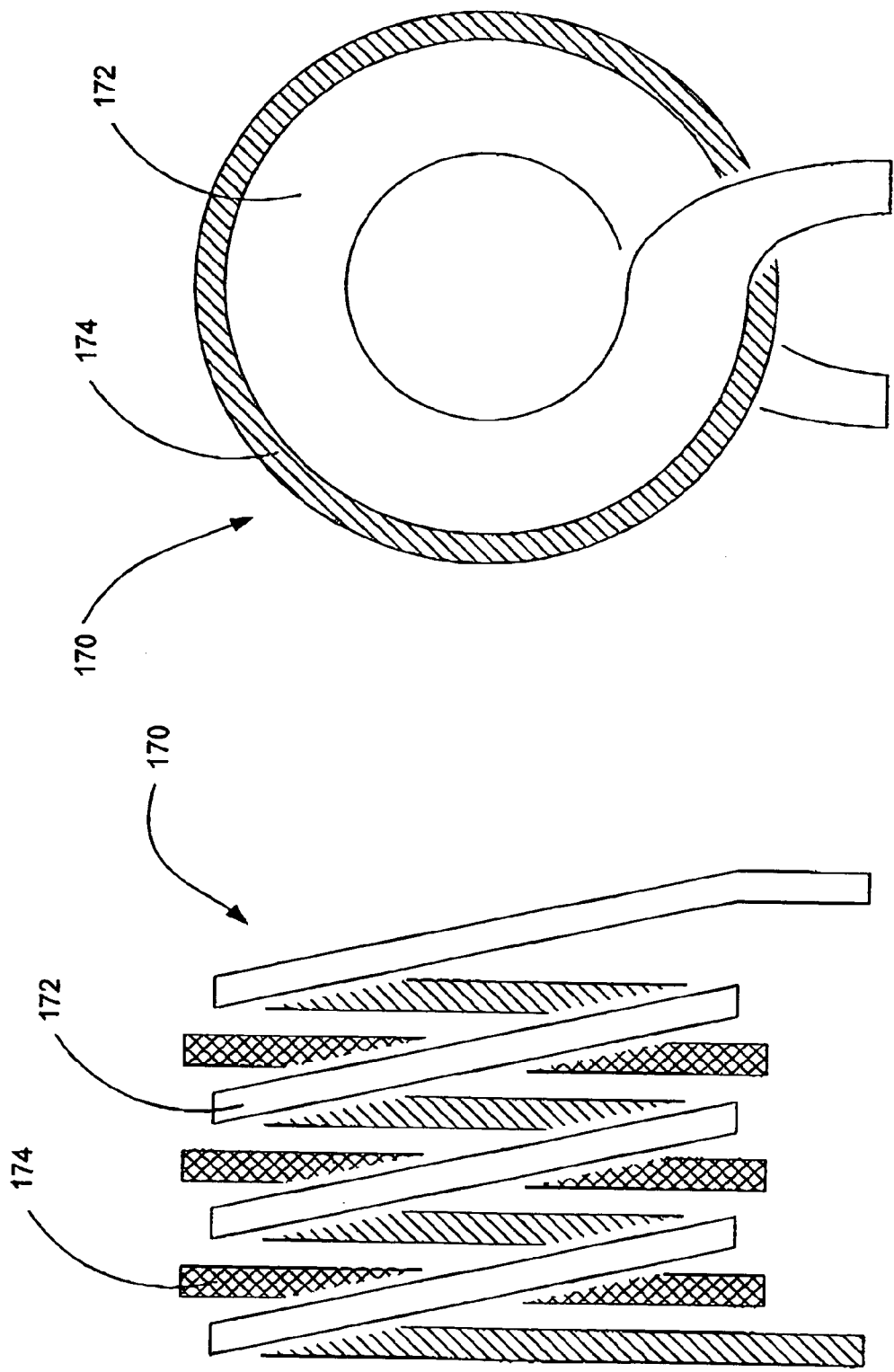

NANOLAYER THICK FILM PROCESSING SYSTEM AND METHOD

This Application is a Continuation of Application No. 09/954,244 filed on Sep. 10, 2001, entitled: "Nanolayer Thick Film Processing System and Method."

BACKGROUND

The present invention relates to semiconductor thin film processing by nanolayer deposition ("NLD"). The fabrication of modem semiconductor device structures has traditionally relied on plasma processing in a variety of operations such as etching and deposition. Plasma etching involves using chemically active atoms or energetic ions to remove material from a substrate. Deposition techniques employing plasma includes Chemical Vapor Deposition ("CVD") and Physical Vapor Deposition ("PVD") or sputtering.

PVD uses a high vacuum apparatus and generated plasma that sputters atoms or clusters of atoms toward the surface of the wafer substrates. PVD is a line-of-sight deposition process that is more difficult to achieve conformal film deposition over complex topography, such as deposition of a thin and uniform liner or barrier layer over the small trench or via of 0.13 µm or less, especially with high aspect ratio greater than 4:1.

In CVD, a gas or vapor mixture is flowed over the wafer surface at an elevated temperature. Reactions then take place at the hot surface where deposition takes place. Temperature of the wafer surface is an important factor in CVD deposition, as it depends on the chemistry of the precursor for deposition and affects the uniformity of deposition over the large wafer surface. The high temperatures typically required for CVD deposition may not be compatible with other processes in the semiconductor process. Moreover, CVD at lower temperature tends to produce low quality films in term of uniformity and impurities. More details on PVD and CVD are discussed in International Pub. Number WO 00/79019 A1 or PCT/US00/17202 to Gadgil, the content of which is incorporated by reference.

In atomic layer deposition ("ALD"), various gases are injected into a chamber for as short as 100–500 milliseconds in alternating sequences. For example, a first gas is delivered into the chamber for about 500 milliseconds and the substrate is heated, then the first gas (heat optional) is turned off. Another gas is delivered into the chamber for another 500 milliseconds (heat optional) before the gas is turned off. The next gas is delivered for about 500 milliseconds (and optionally heated) before it is turned off. This sequence is repeated until all gases have been cycled through the chamber, each gas sequence forming a highly conformal monolayer. ALD technology thus pulses gas injection and heating sequences that are between 100 and 500 milliseconds.

The ALD approach requires a high dissociation energy to break the bonds in the various precursor gases, which can be, for example, silane and oxygen. ALD thus requires high substrate temperature, for example, on the order of 600–800 degrees Celsius for silane and oxygen processes.

U.S. Pat. No. 5,916,365 to Sherman, entitled "Sequential chemical vapor deposition" provides for sequential chemical vapor deposition by employing a reactor operated at low pressure, a pump to remove excess reactants, and a line to introduce gas into the reactor through a valve. Sherman teaches exposing the part to be coated to a gaseous first reactant, including a non-semiconductor element of the thin film to be formed, wherein the first reactant adsorbs on the part to be coated. The Sherman process produces submonolayers as a result of adsorption. The first reactant forms a monolayer on the part to be coated (after multiple cycles), while the second reactant passes through a radical generator which partially decomposes or activates the second reactant into a gaseous radical before it impinges on the monolayer. This second reactant does not necessarily form a monolayer, but is available to react with the monolayer. A pump removes the excess second reactant and reaction products completing the process cycle. The process cycle can be repeated to grow the desired thickness of film.

U.S. Pat. No. 6,200,893 to Sneh entitled "Radical-assisted sequential CVD" discusses a method for CVD deposition on a substrate wherein radical species are used in alternate steps to depositions from a molecular precursor to treat the material deposited from the molecular precursor and to prepare the substrate surface with a reactive chemical in preparation for the next molecular precursor step. By repetitive cycles, a composite integrated film is produced. In a preferred embodiment, the depositions from the molecular precursor are metals, and the radicals in the alternate steps are used to remove ligands remaining from the metal precursor reactions, and to oxidize or form a nitride of the metal surface in subsequent layers.

In one embodiment taught by Sneh, a metal is deposited on a substrate surface in a deposition chamber by: (a) depositing a monolayer of metal on the substrate surface by flowing a molecular precursor gas or vapor bearing the metal over a surface of the substrate, the surface saturated by a first reactive species with which the precursor will react by depositing the metal and forming reaction product, leaving a metal surface covered with ligands from the metal precursor and therefore not further reactive with the precursor; (b) terminating flow of the precursor gas or vapor; (c) purging the precursor with inert gas; (d) flowing at least one radical species into the chamber and over the surface, the radical species highly reactive with the surface ligands of the metal precursor layer and eliminating the ligands as reaction product, and also saturating the surface, providing the first reactive species; and (e) repeating the steps in order until a metallic film of desired thickness is achieved.

In another aspect of the Sneh disclosure, a metal nitride is deposited on a substrate surface in a deposition chamber by: (a) depositing a monolayer of metal on the substrate surface by flowing a metal precursor gas or vapor bearing the metal over a surface of the substrate, the surface saturated by a first reactive species with which the precursor reacts by depositing the metal and forming reaction product, leaving a metal surface covered with ligands from the metal precursor and therefore not further reactive with the precursor; (b) terminating flow of the precursor gas or vapor; (c) purging the precursor with inert gas; (d) flowing a first radical species into the chamber and over the surface, the atomic species highly reactive with the surface ligands of the metal precursor layer and eliminating the ligands as reaction product and also saturating the surface; (e) flowing radical nitrogen into the chamber to combine with the metal monolayer deposited in step (a), forming a nitride of the metal; (f) flowing a third radical species into the chamber terminating the surface with the first reactive species in preparation for a next metal deposition step; and (g) repeating the steps in order until a composite film of desired thickness results.

The Sneh embodiments thus deposit monolayers, one at a time. Because the objective is to create a thick film, the Sneh process is relatively time-consuming.

Atomic layer deposition (ALD or ALCVD) is a modified CVD process that is temperature-sensitive and flux-independent. ALD is based on a self-limiting surface reaction. ALD provides a uniform deposition over complex topography and is temperature-independent, since the gases are adsorbed onto the surface. ALD can occur at lower temperature than CVD, because ALD is an adsorption regime.

As discussed in connection with the Sherman and Sneh patents, above, the ALD process includes cycles of flowing gas reactant into a chamber, adsorbing one sub-monolayer onto the wafer surface, purging the gas reactant, flowing a second gas reactant into the chamber, and reacting the second gas reactant with the first gas reactant to form a monolayer on the wafer substrate. Thick film is achieved by deposition of multiple cycles.

Precise thickness can be controlled by number of cycles, since a single monolayer is deposited as a result of each cycle. However, the conventional ALD method is a slow process to deposit films such as those around 100 angstroms in thickness. Growth rate of Atomic Layer Epitaxy ("ALE") TiN for example was reported at 0.2 angstrom/cycle, which is typical of metal nitrides from corresponding chlorides and $NH_3$.

The throughput in device fabrication for a conventional ALD system is slow. Even if the chamber is designed with minimal volume, the throughput is still slow due to the high number of cycles required to achieve the desired thickness. Conventional ALD is a slower process than CVD, with ALD having a rate of deposition almost 10 times slower than CVD. The process is also chemical-dependent; that is, it is necessary to ensure the proper self-limiting surface reaction for deposition.

SUMMARY

In one aspect, a nano-layer deposition ("NLD") process of depositing a thin film by chemical vapor deposition includes evacuating a chamber of gases; exposing a device to a gaseous first reactant, wherein the first reactant deposits on the device to form the thin film; evacuating the chamber of gases; and exposing the device, coated with the first reactant, to a gaseous second reactant under plasma, wherein the thin film deposited by the first reactant is treated to form the same materials or a different material.

Embodiments of the present invention can include one or more of the following. The device can be a wafer. The plasma either can enhance or maintain the thin film conformality. The plasma can be a high density plasma with density exceeding $5 \times 10^9$ ion/$cm^3$. The reactant can be a metal organic, organic, to form a thin film of metal, metal nitride, or metal oxide. The second reactant is exposed under pressure, above 100 mT. The first and second reactants react and the reaction creates a new compound. The thin film thickness is more than one atomic layer in thickness. The thin film thickness can be between a fraction of a nanometer and tens of nanometers. The plasma can be sequentially pulsed for each layer to be deposited. The plasma can be excited with a solid state radio frequence ("RF") plasma source, such as a helical ribbon electrode. The chamber containing the device can be purged.

The process includes pre-cleaning a surface of a device; evacuating a chamber; stabilizing precursor flow and pressure; exposing the device to a first reactant, wherein the first reactant deposits on the device to form the nanolayer thin film having a thickness of more than one atomic layer; purging the chamber; evacuating the chamber; striking the plasma; performing a plasma treatment on the deposited film; exposing the device, coated with the first reactant, to a gaseous second reactant under the plasma treatment, wherein the thin film deposited by the first reactant is treated to form the same materials or a different material. Repeating the above cycle deposits a thick film, where the thickness is determined by the number of times the cycle is repeated.

In another aspect, the deposition steps discussed above can take place in multiple chambers. The process includes pre-cleaning of the device surface; evacuating the chamber; stabilizing precursor flow and pressure; exposing the device to a first reactant, wherein the first reactant deposits on the device to form the nanolayer thin film having a thickness of more than one atomic layer; purging the chamber; and, evacuating the chamber. The device then is transferred to another chamber that is purged and pumped. The next step is striking the plasma, followed by performing a plasma treatment on the deposited film; exposing the device, coated with the first reactant in the first chamber, to a gaseous second reactant under the plasma treatment in the second chamber, wherein the thin film deposited by the first reactant is treated to form the same materials or a different material. Repetition of this cycle in the first and second chambers deposits a thick film, wherein the thickness of the resulting film depends upon the number of cycles of repetitions.

In another aspect of the invention, an apparatus to perform semiconductor processing includes a high density inductively-coupled plasma source enclosed in a process chamber, wherein a device is exposed inside the chamber to a gaseous first reactant. The first reactant deposits on the device to form a thin film. After purging, the device, coated with the first reactant, is exposed to a gaseous second reactant under plasma, wherein the thin film deposited by the first reactant is treated to form the same materials or a different material. The method can provide deposition of copper metal from Cu hfacI and plasma (gas), Cu hfacII and plasma (gas), $CuI_4$ and plasma (gas), $CuCl_4$ and plasma (gas), and organo metallic and plasma (gas); of titanium nitride from tetrakisdimethyl titanium ("TDMAT") and plasma (gas), tetrakisdiethyl titanium ("TDEAT") and plasma (gas), tetrakis (methylethylamino) titanium ("TMEAT") and plasma (gas), $TiCl_4$ and plasma (gas), $TiI_4$ and plasma (gas), and organo metallic and plasma (gas); of tantalum nitride from penta-dimethyl-amino-tantalum ("PDMAT") and plasma (gas), pentakis (diethylamido)tantalum ("PDEAT") and plasma (gas), and organo metallic and plasma (gas); wherein gas is one of $N_2$, $H_2$, Ar, He, $NH_3$, and combination thereof.

Implementations of the apparatus can include gas distribution, chuck, vaporizer, pumping port to pump, and port for gas purge.

Advantages of the system may include one or more of the following. The resulting deposition is highly conformal and is similar in quality to that of ALD. The nanolayer thick film deposition process provides almost 100% conformal deposition on complex topography as that in semiconductor devices having 0.1 micron width with an aspect ratio greater than 8:1. Excellent conformality of film is achieved with NLD similar to that of ALD, and far superior than conformality of thick CVD film. Further, such conformality is achieved rapidly, since multiple atomic layers up to a few nanometers thick are deposited as a result of each cycle of NLD. In contrast, ALD processes only one wafer at a time, requires a small volume, deposits only one monolayer at a time. The advantage of NLD over ALD thus is higher throughput over ALD.

The microstructure of the film resulting from NLD can be of a nanocrystalline grain structure in an amorphous matrix using the NLD technique, since a film of more than a monolayer to a few nanometer thick is deposited in each cycle. This structure is not typical of conventional CVD or PVD. The surface morphology of the films deposited by NLD is also smoother than that of films deposited by conventional CVD. This microstructure and morphology can be ideal for certain applications. In the application of copper diffusion barrier thin film deposition, this microstructure of the barrier thin film is a key to the resistance to copper. In fact, our initial data show that our NLD TiN film deposited from TDMAT precursor and $N_2$ plasma has superior barrier properties to PVD TiN, PVD TaN, or conventional CVD TiN. Additionally, the low temperature of the NLD deposition process, which can be lower than that of CVD, is consistent with the processing requirements of advanced films, such as low-k dielectric.

The precursors or gases usable in the NLD process are not limited to those having the self-limiting surface reactions, since NLD is a deposition process. NLD thus employs a much broader spectrum of precursors and can be used to deposit a vast number of film materials from a variety of available precursors. Since NLD has high throughput, minizing the chamber volume, as is necessary in ALD, is not necessary. Consequently, a conventional CVD chamber can be used to achieve highly conformal, high quality, high throughput films.

Other advantages of the system may include one or more of the following. The helical ribbon provides a highly uniform plasma which does not require a chamber with a small volume. The system enables high precision etching, deposition, or sputtering performance. This is achieved using the pulse modulation of a radio frequency-powered plasma source, which enables a tight control over the radical production ratio in plasmas, the ion temperature, and charge accumulation. Also, since the time for accumulation of charges in a wafer is on the order of milli-seconds, the accumulation of charges to the wafer is suppressed by the pulse-modulated plasma on the order of micro-seconds, and this enables the suppression of damage to devices on the wafer caused by the charge accumulation and of notches caused during the electrode etching process. The system requires that the substrate be heated to a relatively low temperature, such as 400 degrees Celsius.

Yet other advantages may include one or more of the following. The system attains highly efficient plasma operation in a compact substrate process module that can attain excellent characteristics for etching, depositing or sputtering of semiconductor wafers, as represented by high etch rate, high uniformity, high selectivity, high anisotropy, and low damage. The system achieves high density and highly uniform plasma operation at low pressure for etching substrates and for deposition of films on to substrates. Additionally, the system is capable of operating with a wide variety of gases and combinations of gases, including highly reactive and corrosive gases.

BRIEF DESCRIPTION OF THE DRAWINGS

FIGS. 1A–1E show exemplary embodiments of a plasma processing system with a helical ribbon.

FIGS. 2A–2C show more details of the helical ribbon of FIG. 1.

DESCRIPTION

Figure 1A:
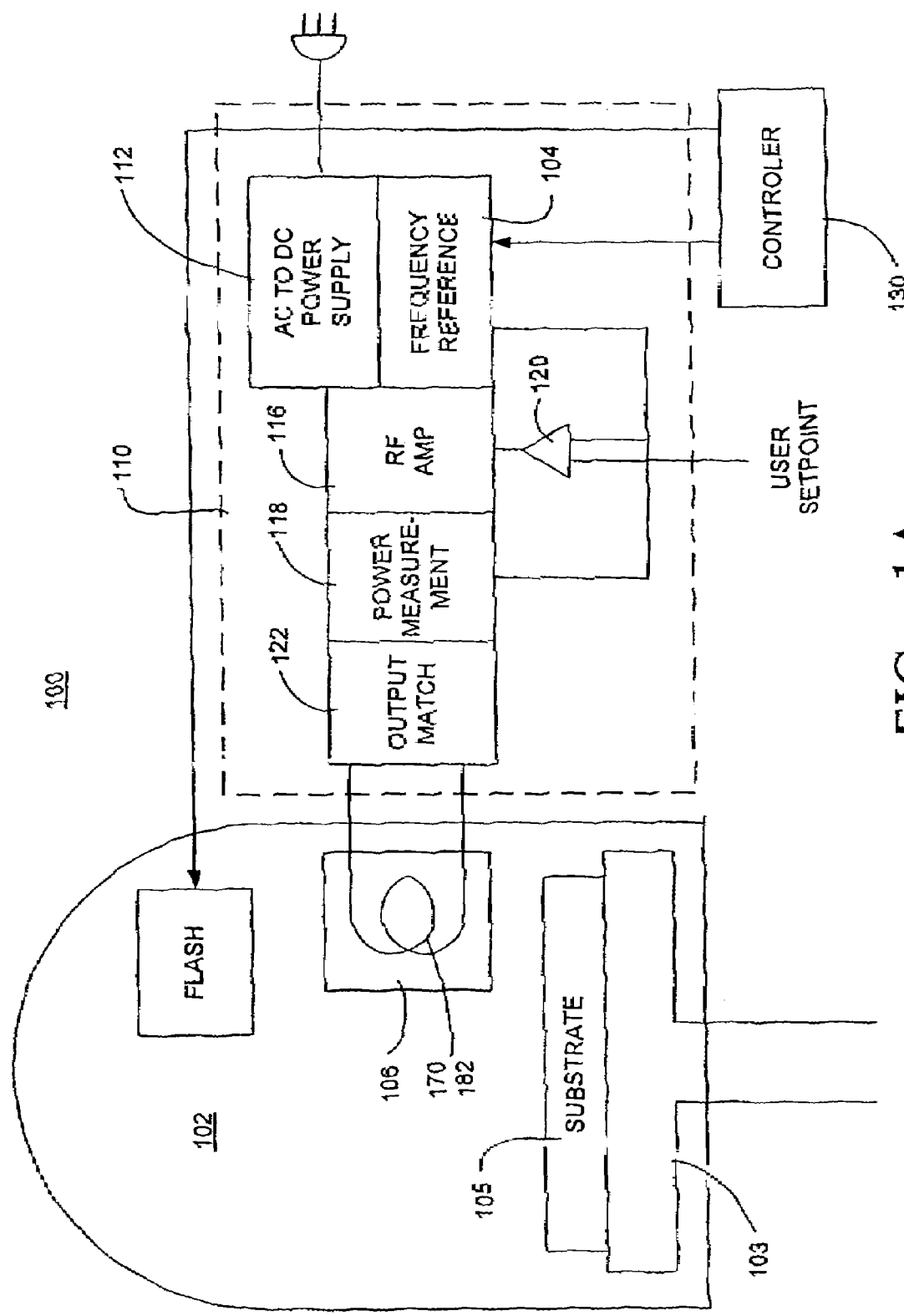

FIG. 1A shows an exemplary plasma processing system 100 with a processing chamber 102. The process chamber 102 has a chamber body enclosing components of the process chamber such as a chuck 103 supporting a substrate 105. The process chamber typically maintains vacuum and provides a sealed environment for process gases during substrate processing. The process chamber periodically must be accessed to cleanse the chamber. An opening typically is provided for maintenance at the top of the process chamber that is sufficiently large to provide access to its the internal components.

The chamber 102 includes a plasma excitation circuit 106 driven by a solid-state plasma generator 110 with fast ignition capability. One commercially available plasma source is the Litmas source, available from LITMAS Worldwide of Matthews, North Carolina. The generator 110 includes a switching power supply 112 that is connected to an alternating current (AC) line. The power supply 112 rectifies AC input and switches the AC input to drive an RF amplifier 116. The RF amplifier 116 operates at a reference frequency (13.56 MHz, for example) provided by a reference frequency generator 104. The RF amplifier 116 drives current through a power measurement circuit 118 that provides feedback signals to a comparator 120 and to the reference frequency generator 104. In this embodiment, power is measured only once, and the information is used to control the RF amplifier 116 gain, as well as a tuning system if needed. Power is then delivered to an output match section 122, which directly drives the plasma excitation circuit 106. In one embodiment (FIG. 1C), the plasma excitation circuit 106 uses helical ribbon electrodes 170 in the chamber. However, other equivalent circuits can be used, including (FIG. 1B) an external electrode of capacitance coupling or inductance coupling type, for example.

Positioned above the helical ribbon electrodes 170 is a heat exchanger 182 that removes heat from the helical ribbon electrodes 170 during operation. In one embodiment, the heat exchanger is a pipe that circulates fluid to remove heat. The fluid moves through the pipe and the helical ribbon electrodes 170. Fluid then enters the heat exchanger 182 and traverses through a loop. Thermal energy in the form of heat transfers to fluid in another loop, which is cooler in temperature and draws heat away from the heat in the fluid in the first loop. In a specific embodiment, cooling fluid enters and leaves the heat exchanger 182.

A controller 130 generates a periodic pulse and drives one input of the frequency reference 104. The pulse effectively turns on or off the plasma generation. One embodiment of the controller 130 generates a pulse with a frequency of ten hertz (10 Hz) or less. In another embodiment, the pulse generated has a pulse-width of approximately two hundred fifty (110) millisecond and the pulse is repeated approximately every fifty (50) microseconds.

Figure 1B:
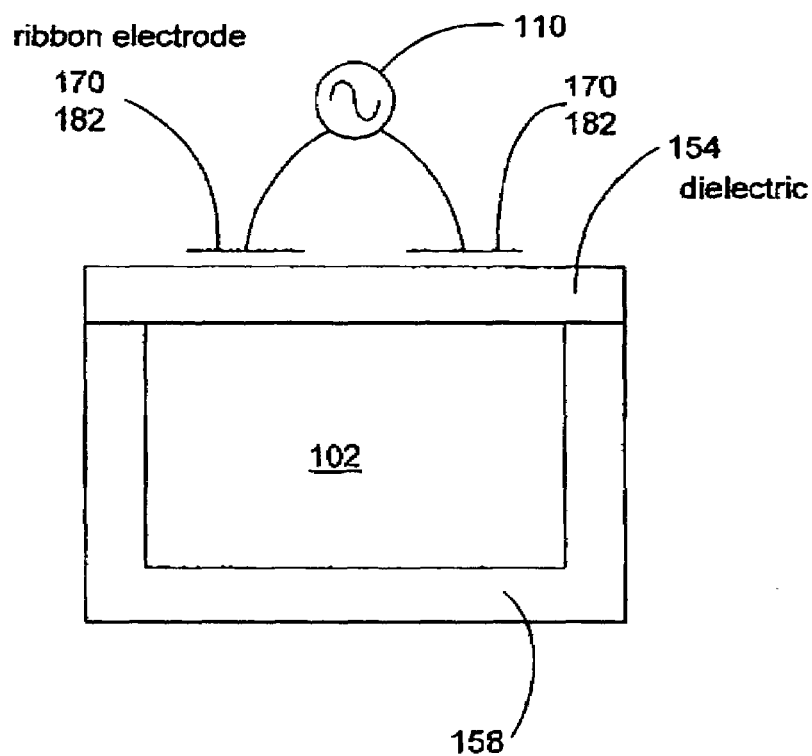

Turning now to FIG. 1B, a second embodiment is shown. FIG. 1B includes a helical ribbon electrode 170 connected to a generator 110. The helical ribbon electrode 170 rests above a dielectric wall 154. The dielectric wall 154 rests above a chamber 102 and is supported by chamber walls 158. The dielectric wall 154 allows the energy generated from the generator 110 to pass through to generate a plasma inside the chamber 102. The dielectric materials can be any non-metallic materials such as ceramic, glass, quartz, or plastic.

Figure 1C:
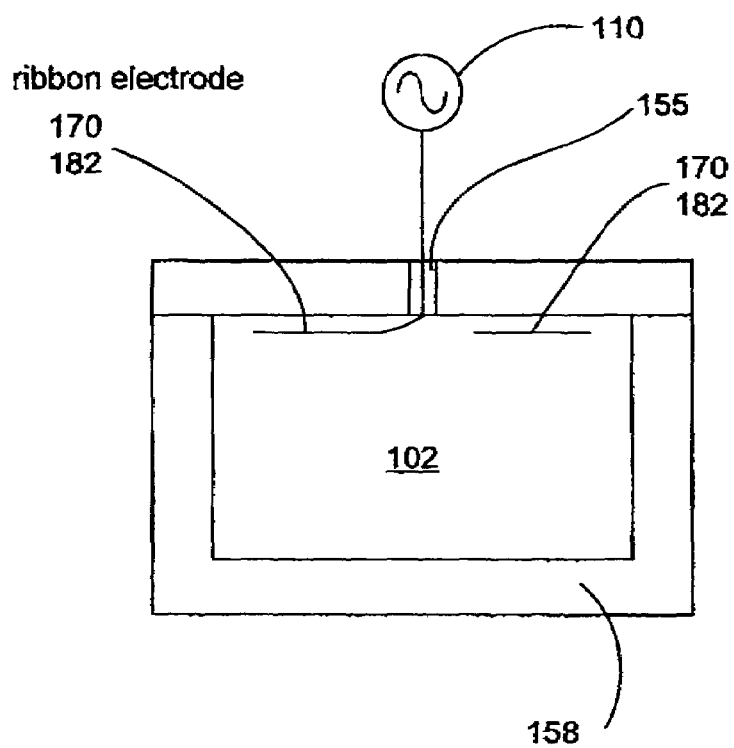

FIG. 1C shows a third embodiment where the helical ribbon electrode 170 is positioned inside a chamber 102 with walls 158. The walls 158 have an electrical feed through 155, through which the generator 110 can drive the helical ribbon electrode 170. There need not be a dialectric plate 154.

FIG. 1D shows a fourth embodiment where the helical ribbon electrode 170 wraps around a tubular dielectric wall 154. A chamber 102 is positioned within the helical ribbon electrode 170 and the tubular dielectric wall 154, through which the generator 110 can drive the helical ribbon electrode 170.

Figure 1E:
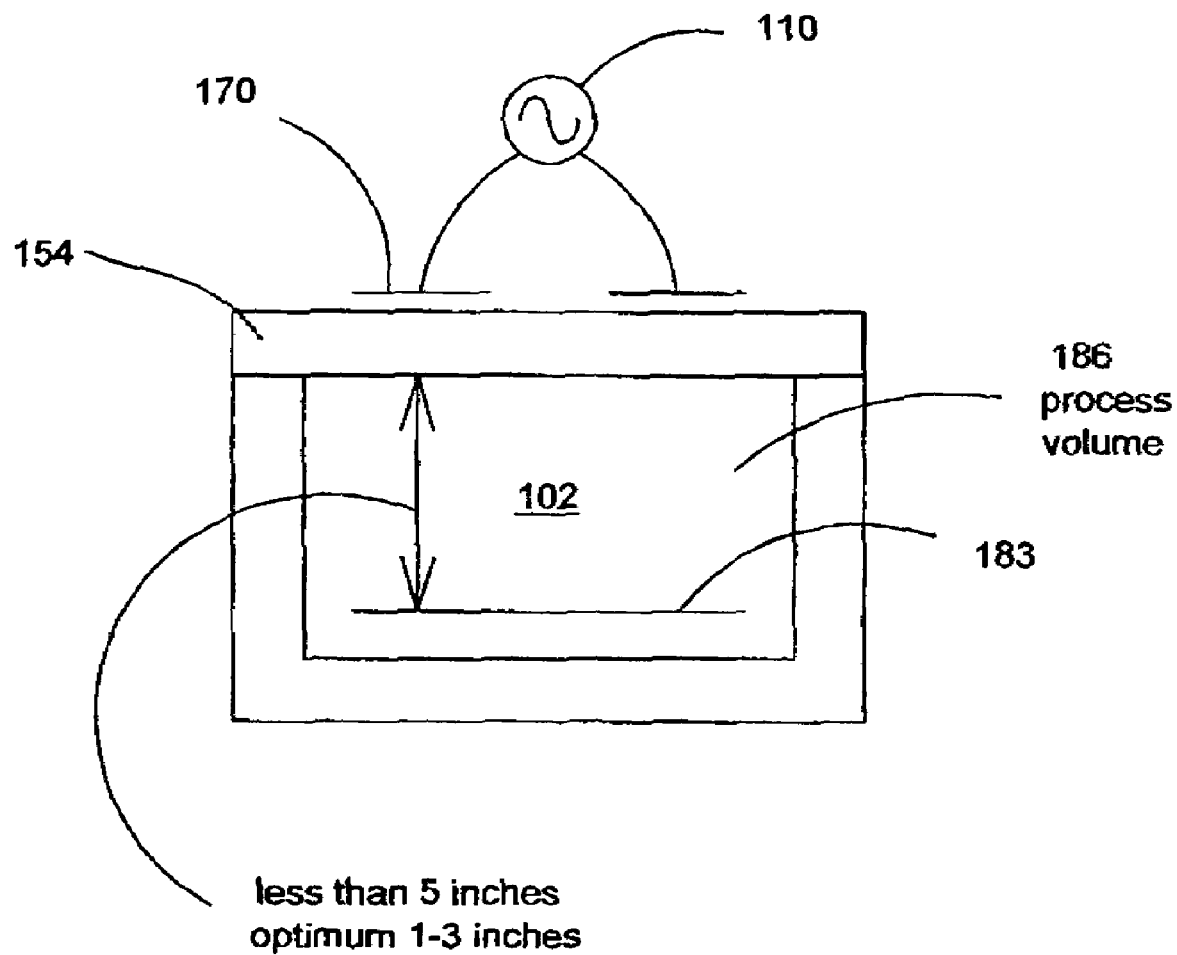

FIG. 1E shows a fifth embodiment optimized for pulsed processing. This embodiment has a helical ribbon electrode 170 connected to a generator, with the helical ribbon resting above a dialectric wall 154. This embodiment further has an elongated chamber 102 with a small volume 186 above a wafer 183. The volume is dependent on the diameter of the wafer 183 and the distance between the helical ribbon electrode 170 and the wafer. Typically, the distance is less than five (5) inches, but can also be between one and three inches. The helical ribbon electrode 170 in turn is driven by the generator 110. The large ratio of the width to the thickness of the helical ribbon electrode allows the short distance and still offers the plasma uniformity required on the wafer surface.

The characteristics of a film deposited by the above techniques depend upon the electron temperature in the plasma, the energy of ion incident on a substrate, and the ions and radicals produced in the vicinity of an ion sheath. The electron temperature distribution in the plasma, the kinds of ions and radicals produced in the plasma, and the ratio between the amount of ions and radicals, can be controlled by modulating a high-frequency voltage in the same manner explained with respect to plasma etching. Accordingly, when conditions for depositing a high quality film are known, the discharge plasma is controlled by a modulated signal according to the present invention, so that the above conditions are satisfied. Thus, the processing characteristics with respect to film deposition can be improved.

Figure 2C:
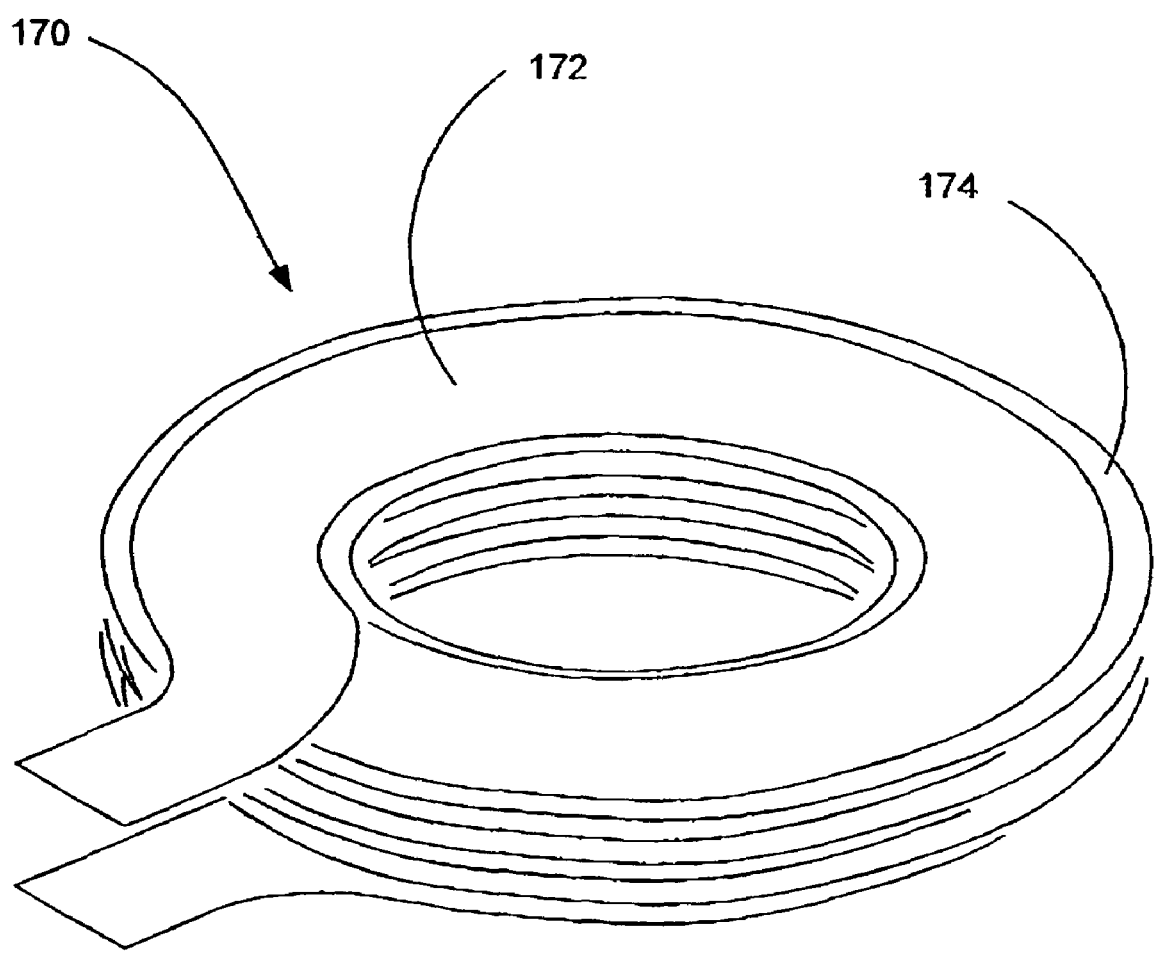

FIGS. 2A–2C show more details of the helical ribbon electrode 170. In FIG. 2A, an elongate conductive coil 172 insulated by a sheet of dielectric material 174 is wound to form a cylindrical helix. The two sides of the helix are then compressed into planes such that the coil 172 surfaces in each side lie flat and engage the adjacent side of the sheet of dielectric material 174.

The ribbon coil 172 can have about three to ten turns and can be made of any conductive, ductile metal, such as copper or aluminum. The coil 172 has a width that is substantially greater than its thickness. Preferably, the width is approximately one hundred times the thickness, although the ratio of width w to thickness t may conceivably range from 1 to 10000, depending on mechanical considerations and/or electrical parameters. Mechanical considerations affecting the optimum width:thickness ratio include, for example, build height and turns ratio. In one embodiment, the coil 172 can have three turns, with the width of the coil 172 at about 40 millimeters and a thickness at about one millimeter.

Electrical parameters affecting the optimum width:thickness ratio include, for example, electrical resistance, skin effect, and proximity effect. During manufacturing, the conductive coil 172 and dielectric sheet 174 are wound in one continuous direction on a cylindrical mandrel and then compressed into a plane. With the exception of the outer-most coil layers, the compressed coil engages on one side a sheet of dielectric material, and on the other side a sheet of dielectric material. Bends (not shown) are formed in the ribbon coil 172 near the ends so that the ends project radially from conductive coil 172 for external connection.

The conductive coil 172 is then compressed into a pan-cake with multiple layers such that the coils lie flat and engage one side of the dielectric material sheet 174. The compressed sides form a flat coil. The width of the conductive coil 172 is less than the width of the dielectric material sheet 174 such that, when compressed, the interior or exterior of adjacent coil surfaces do not touch. The ends of the ribbon coil 172 project from the outer coil surfaces, where they can be attached to other electrical components.

The coil 172 can be adhered to sheet 174 of dielectric material by at least two methods. One method is to provide a sheet of dielectric material that is coated on both sides with thermal-set adhesive. After compression, a winder is heated sufficiently to activate the thermal-set adhesive to adhere the coil 172 to the dielectric material sheet 174. A second method is to adhere the coil 172 to sheet 174 by insulating adhesive tape disposed between each coil layer. In one embodiment, the helical ribbon electrode 170 is available from LITMAS Corporation of Matthews, North Carolina.

The helical ribbon electrode 170 enhances the uniformity of power density due to its width:thickness ratio. Power transmittance is higher because the helical ribbon electrode 170 is closer to the chamber. The result is reduced power loss. The helical ribbon electrode 170 is low in profile, and supports a high density, low profile semiconductor processing system.

Figure 3:
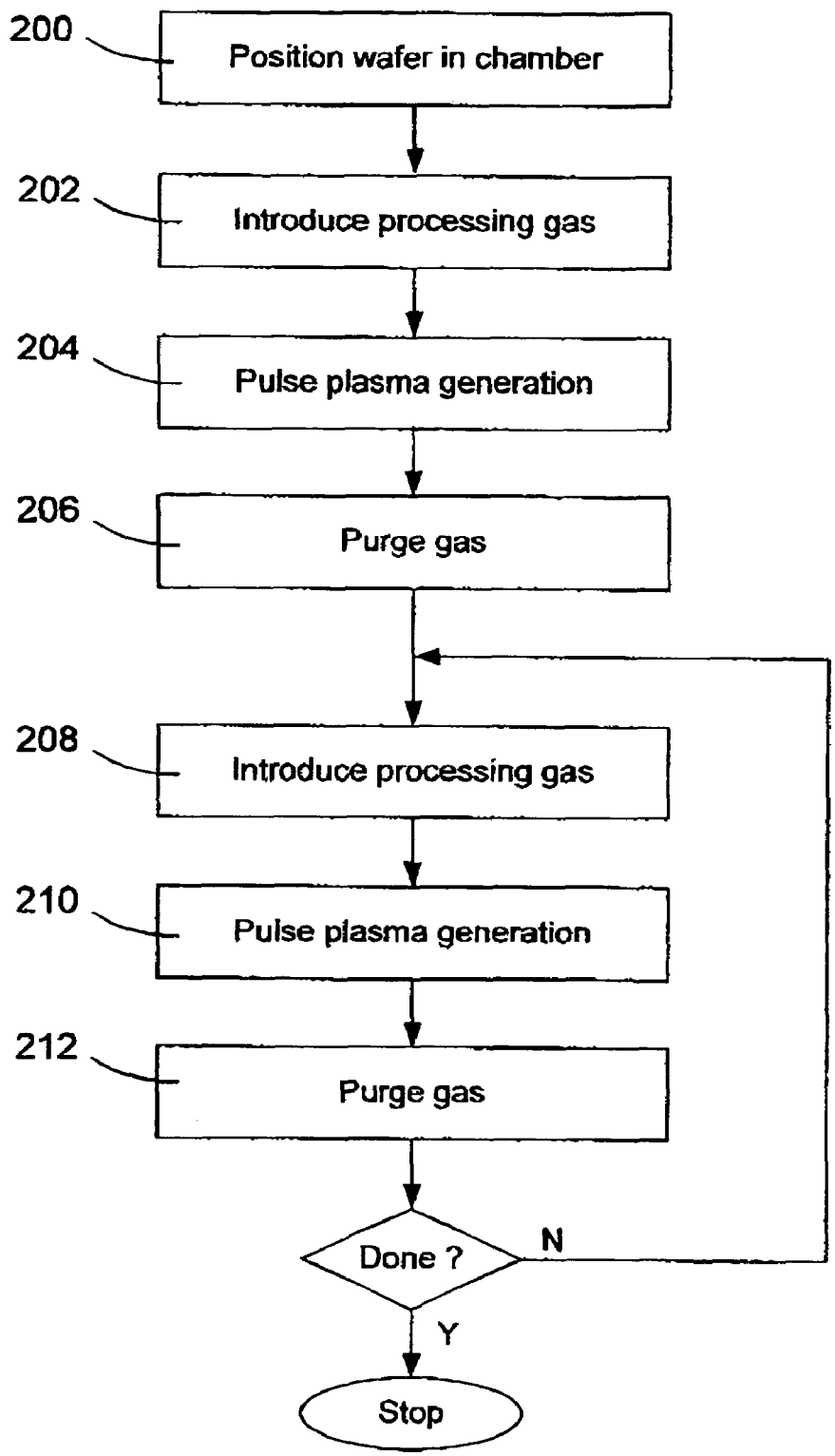
FIG. 3 shows a flowchart of one exemplary semiconductor manufacturing process using the system of FIG. 1.

FIG. 3 shows a flowchart of one exemplary semiconductor manufacturing process using the system 100 of FIG. 1. First, a wafer is positioned inside the chamber (step 200). Next, suitable processing gas is introduced into the chamber (step 202). The chamber is pressurized to a pressure level such as four hundred millitorr (400 mT). The pressure level can range between about one hundred millitorr (100 mT) to about ten torr (10T) (step 203). The controller 130 (depicted in FIG. 1A) is turned on periodically, in accordance with a process activation switch to drive the desired process (step 204). The particular type of process to be performed affects the process activation switch choice. The choice of activation switch for any device fabrication process, regardless of whether the process is a deposition or etch process, also may significantly affect the final semiconductor device properties. At the conclusion of the processing of one layer of material, the gas in the chamber is purged (step 206), and the chamber is ready to accept further processing. For the next layer of material, suitable processing gas is introduced into the chamber (step 208). The chamber is pressurized to a pressure level above approximately one hundred millitorr (100 mT), and the controller 130 is periodically turned on to drive the desired process (step 210). At the conclusion of the processing of the second layer of material, the gas in the chamber is purged (step 212), and the chamber is ready to accept another processing gas to process and deposit another layer of material. This process is repeated for each layer in the multi-layer film.

In another embodiment, thin film is deposited using chemical vapor deposition by evacuating a chamber of gases; exposing a part to be coated to a gaseous first reactant, wherein the first reactant deposits on the part to form the thin film; evacuating the chamber of gases; exposing the part, coated with the first reactant, to a gaseous second reactant of plasma at a high pressure, wherein the plasma converts the second reactant on the part to one or more elements, wherein the thin film deposited is treated; and, evacuating the chamber of gases.

Figure 4A:
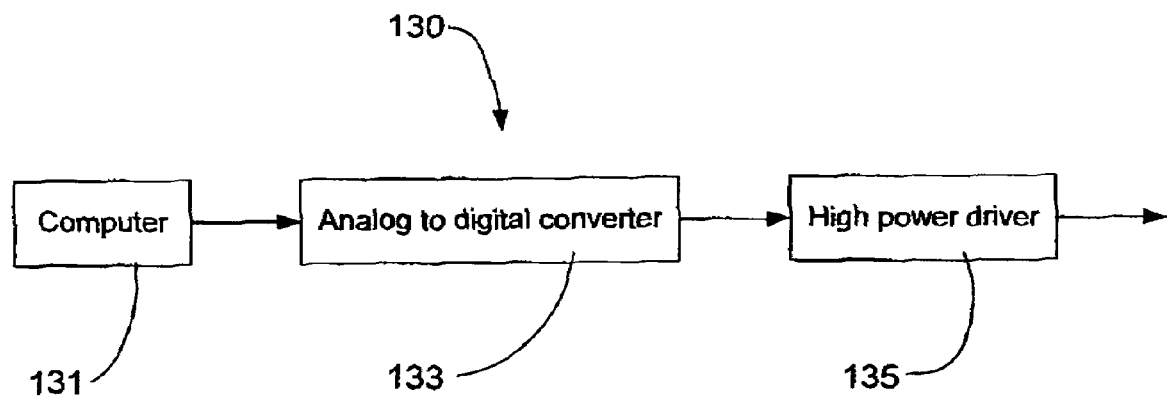
FIGS. 4A–4B show exemplary generator embodiments.

FIG. 4A shows one exemplary controller 130. The controller 130 includes a computer 131 driving a digital to analog converter ("DAC") 133. The DAC 133 generates shaped waveforms and is connected to a high-voltage isolation unit 135 such as a power transistor or a relay to drive the plasma generator 110. The controller 130 can generate various waveforms such as a rectangular wave and a sinusoidal wave, and moreover can change the period and amplitude of such waveforms. Further, in the above explanation, the RF power supplied to a plasma is modulated with a rectangular wave. The modulation wave form is determined in accordance with known factors, including: a desired ion energy distribution; a desired electron temperature distribution; and a desired ratio between the amount of the desired ion and the amount of the desired radical. The use of a rectangular wave as the modulation waveform is advantageous because a processing condition can be readily set and the plasma processing can be readily controlled. It is to be noted that since the rectangular wave modulates the signal from the RF source in a discrete fashion, the rectangular wave can readily set the processing condition, as compared with the sinusoidal wave and the compound wave of it. Further, the pulse generator can also generate amplitude-modulated signals in addition, or in combination with, the frequency-modulated signals.

Figure 4B:
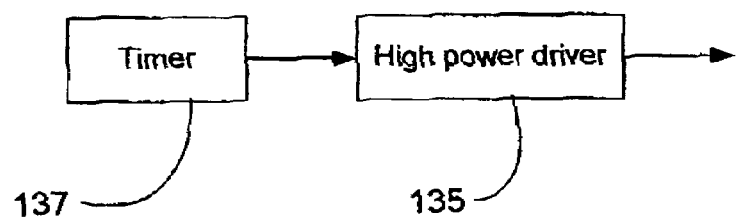

FIG. 4B shows an exemplary embodiment that uses a timer chip such as a 137 timer, available from Signetics of Sunnyvale, Calif. The timer chip 137 is preconfigured through suitable resistive-capacitive ("RC") network to generate pulses at specified intervals. The timer chip 137 generates shaped waveforms and is connected to a high-voltage isolation unit 135, such as a power transistor or a relay, to drive the plasma generator 110 (as in FIG. 1A), as discussed above.

Figure 5:
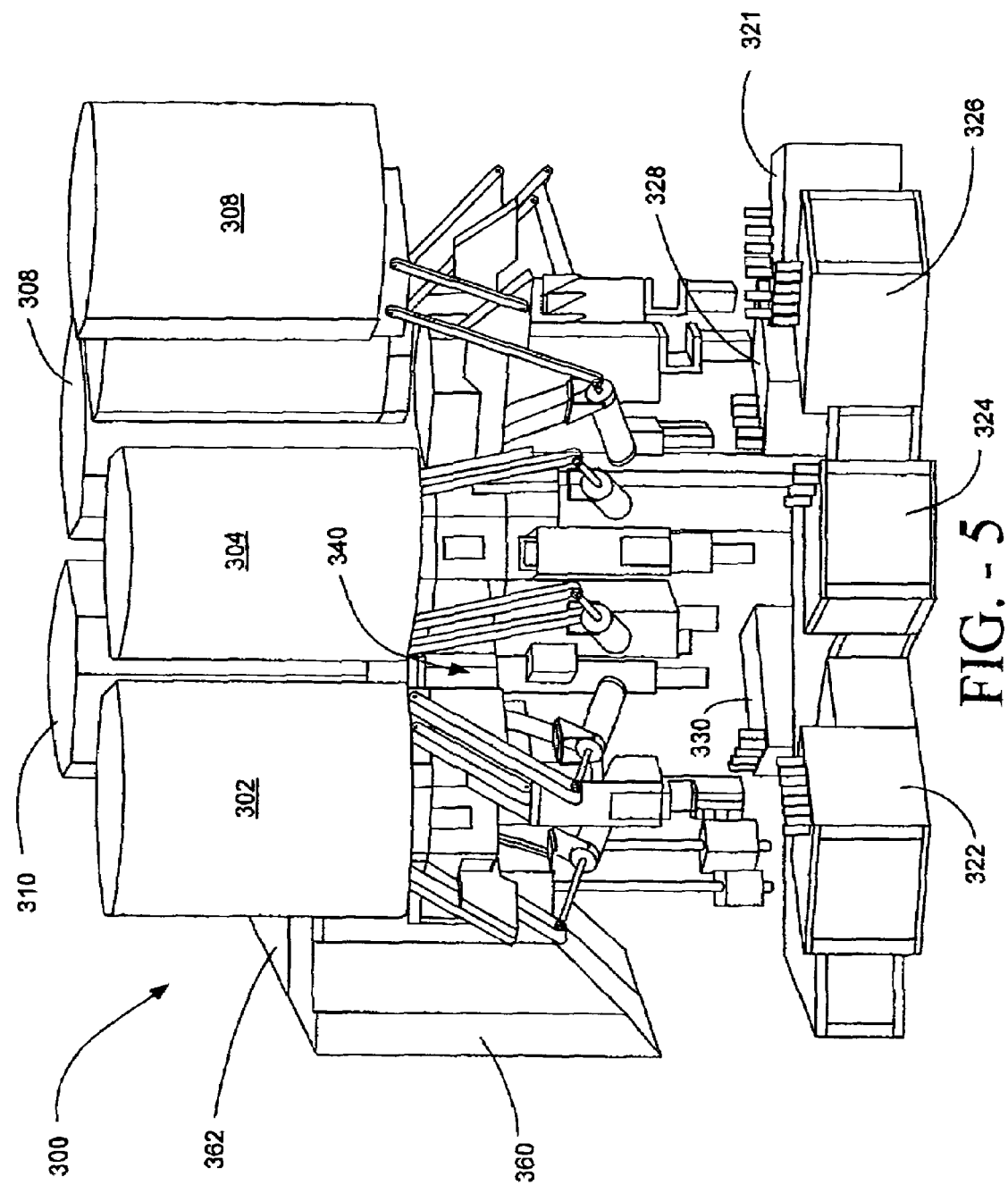
FIG. 5 shows a multi-chamber semiconductor processing system.

Referring now to FIG. 5, a multi-chamber semiconductor processing system 300 is shown. The processing system 300 has a plurality of chambers 302, 304, 306, 308 and 310 adapted to receive and process wafers. Controllers 322, 324, 326, 328 and 330 control each of the chambers 302, 304, 308 and 310, respectively. Additionally, a controller 321 controls another chamber, which is not shown.

Each of chambers 302, 304, 306, 308, 310 has a lid over each chamber body. During maintenance operations, the lid can be actuated into an open position so that components inside the chamber bodies can readily be accessed for cleaning or replacement as needed.

The chambers 302, 304, 306, 308, 310 are connected to a transfer chamber (not visible) that receives a wafer. The wafer rests on top of a robot blade or arm (not depicted). The robot blade receives wafer from an outside processing area.

The transport of wafers between processing areas entails passing the wafers through one or more doors separating the areas. The doors can be load lock chambers 360, 362 for passing a wafer-containing container or wafer boat that can hold about twenty-five wafers in one embodiment. The wafers are transported in the container through the chamber from one area to another area. The load lock can also provide an air circulation and filtration system that effectively flushes the ambient air surrounding the wafers.

Each load lock chamber 360, 362 is positioned between sealed opening (not visible), and provides the ability to transfer semiconductor wafers between fabrication areas. The load locks 360, 362 can include an air circulation and filtration system that effectively flushes the ambient air surrounding the wafers. The air within each load lock chamber 360, 362 can also be purged during wafer transfer operations, significantly reducing the number of airborne contaminants transferred from one fabrication area into the other. The load lock chambers 360, 362 can also include pressure sensors that take air pressure measurements for control purposes.

During operation, a wafer cassette on a wafer boat is loaded at openings in front of the system to a load lock through the load lock doors. The doors are closed, and the system is evacuated to a pressure as measured by the pressure sensors. A slit valve (not shown) is opened to allow the wafer to be transported from the load lock into the transfer chamber. The robot blade takes the wafer and delivers the wafer to an appropriate chamber. A second slit valve opens between the transfer chamber and process chamber, and wafer is brought inside the process chamber.

Containers thus remain within their respective fabrication areas during wafer transfer operations, and any contaminants clinging to containers are not transferred with the wafers from one fabrication area into the other. In addition, the air within the transfer chamber can be purged during wafer transfer operations, significantly reducing the number of airborne contaminants transferred from one fabrication area into the other. Thus during operation, the transfer chamber provides a high level of isolation between fabrication stations.

Figure 6:
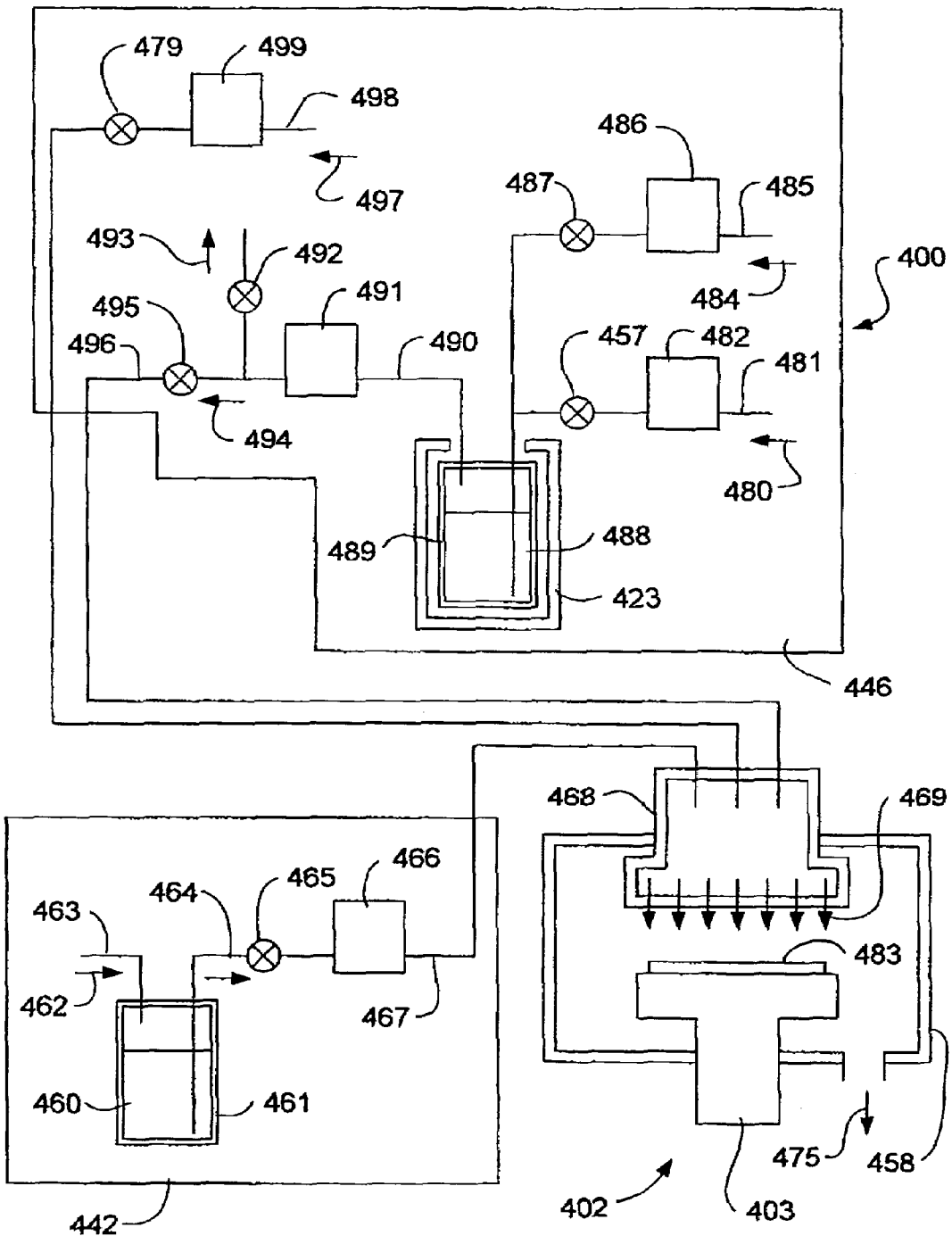
FIG. 6 shows a diagram of an exemplary apparatus for liquid and vapor precursor delivery.

FIG. 6 shows an exemplary apparatus 400 for liquid and vapor precursor delivery using system 100. The apparatus 400 includes a chamber 402 that can be a CVD or NLD chamber. The chamber 402 includes a chamber body 458 that defines an evacuable enclosure for carrying out substrate processing. The chamber body 458 has a plurality of ports including at least a substrate entry port that is selectively sealed by a slit valve and a side port through which a substrate support member can move. The apparatus 400 also includes a vapor precursor injector 446 connected to the chamber 402, and a liquid precursor injector 442 connected to the chamber 402.

In the liquid precursor injector 442, a precursor 460 is placed in a sealed container 461. An inert gas 462, such as argon, is injected into the container 461 through a tube 463 to increase the pressure in the container 461 to cause the liquid precursor 460 to flow through a tube 464 when a valve 465 is opened. The liquid precursor 460 is metered by a liquid mass flow controller 466 and flows into a tube 467 and into a vaporizer 468, which is attached to the CVD or NLD chamber 402. The vaporizer 468 heats the liquid causing the precursor 460 to vaporize into a gas 469 and flow over a substrate 483, which is heated to an appropriate temperature by a susceptor to cause the vaporized precursor 460 to decompose and deposit a layer on the substrate 483. The chamber 402 is sealed from the atmosphere with exhaust pumping 475 and allows the deposition to occur in a controlled partial vacuum.

In the vapor precursor injector 446, a liquid precursor 488 is contained in a sealed container 489 which is surrounded by a temperature controlled jacket 423 and allows the precursor temperature to be controlled to within 0.1° C. A thermocouple (not shown) is immersed in the precursor 488 and an electronic control circuit (not shown) controls the temperature of the jacket 423, which controls the temperature of the liquid precursor and thereby controls the precursor vapor pressure. The liquid precursor can be either heated or cooled to provide the proper vapor pressure required for a particular deposition process. A carrier gas 480 is allowed to flow through a gas mass flow controller 482, when valve 457 and either valve 492 or valve 495, but not both, is opened. Also shown is one or more additional gas mass flow controllers 486 to allow additional gases 484 to also flow when valve 487 is opened, if desired. Additional gases 497 can also be injected into the vaporizer 468 through an inlet tube 498 attached to valve 479, which is attached to a gas mass flow controller 499. Depending on its vapor pressure, a certain amount of precursor 488 will be carried by the carrier gases 480 and 484, and exhausted through tube 493 when valve 492 is open.

After the substrate has been placed into the chamber 402, it is heated by a heater as discussed above. After the substrate has reached an appropriate temperature, valve 492 is closed and valve 495 is opened, allowing the carrier gases 480 and 484 and the precursor vapor to enter the vaporizer 468 through the attached tube 496. Once the precursor 488 is vaporized, it is carried through the mass flow controller 491. Such a valve arrangement prevents a burst of vapor into the chamber 402. A vapor distribution system, such as a shower head 468 or a distribution ring (not shown), is used to evenly distribute the precursor vapor over the substrate 483. After a predetermined time, depending on the deposition rate and the thickness required for the initial film deposition, valve 495 is closed and valve 492 is opened. The flow rate of the carrier gas can be accurately controlled to as little as 1 sccm per minute and the vapor pressure of the precursor can be reduced to a fraction of an atmosphere by cooling the precursor 488. Such an arrangement allows for accurately controlling the deposition rate to less than 10 angstroms per minute, if so desired.

Figure 7:
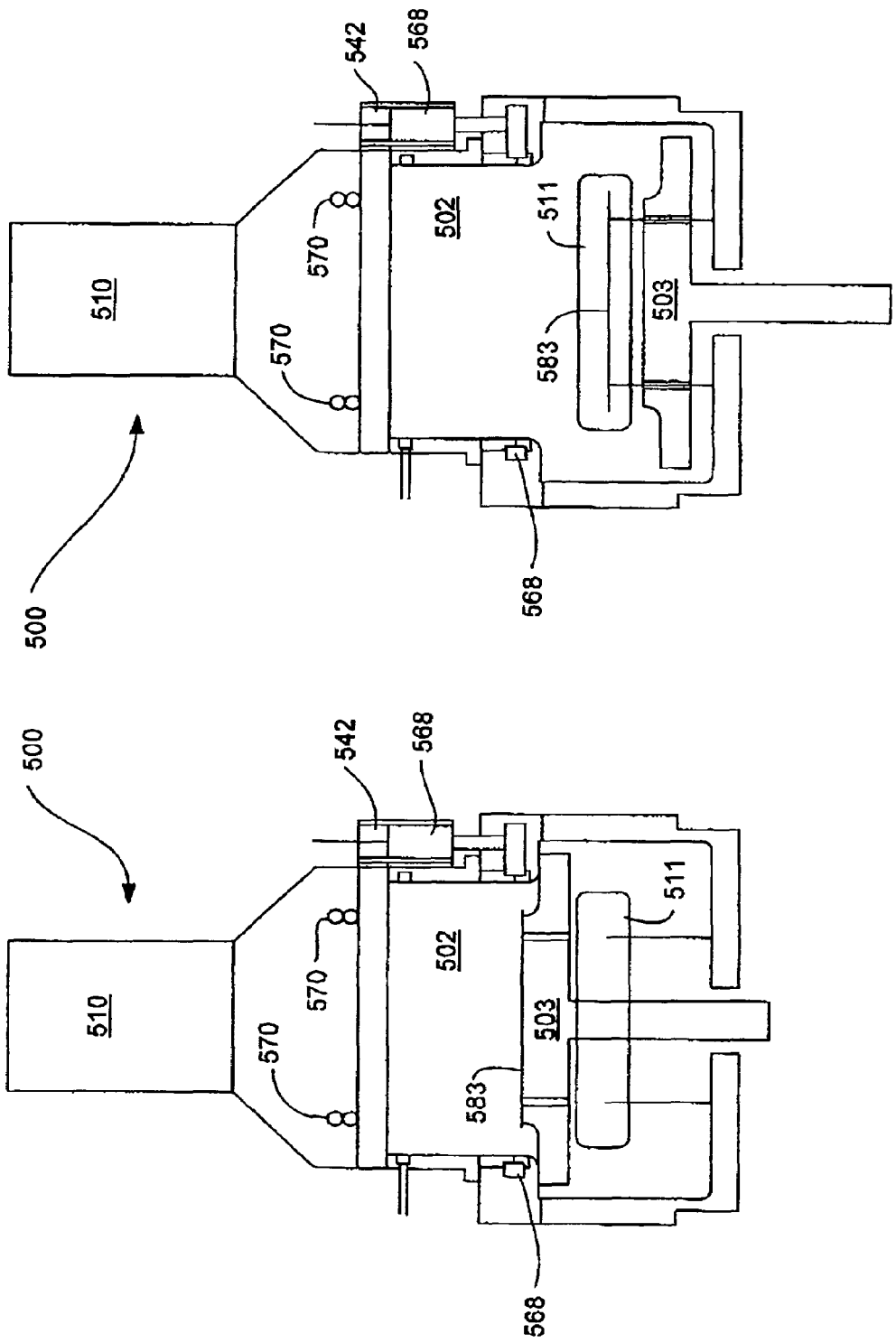
FIGS. 7A–7B show two operating conditions of an embodiment to perform plasma deposition.

FIGS. 7A–7B show two operating conditions of an embodiment 500 to perform high pressure barrier pulsed plasma atomic layer deposition. FIG. 7A shows the embodiment 500 in a deposition condition, while FIG. 7B shows the embodiment 500 in a rest condition. Referring now to FIGS. 7A–7B, a chamber 502 receives gases through one or more gas inlets 467, 496, 498, as shown in FIG. 6. A solid state plasma generator 510 is mounted on top of the chamber 502 and one or more plasma excitation coils 570 are positioned near the gas inlets 568. A liquid precursor system 542 introduces precursor gases through a vaporizer 568 into the chamber 502 using a precursor distribution ring 568 (see also 469 in FIG. 6).

A chuck 503 movably supports a substrate 583. In FIG. 6A, the chuck 503 and the substrate 583 are elevated and ready for deposition. The substrate 583 is positioned inside the chamber. Suitable processing gas is introduced into the chamber through the inlets 568, and a pulsed plasma controller 510 is periodically turned on in accordance with a process activation switch to drive the desired process. The particular type of process to be performed affects the process activation switch choice. The choice of activation switch for any device fabrication process, regardless of whether the process is a deposition or etch process, also may significantly affect the final semiconductor device properties. At the conclusion of the processing of one layer of material, the gas in the chamber 502 is purged, and the chamber 502 is ready to accept further processing. This process is repeated for each layer in the multi-layer wafer. At the conclusion of deposition of all layers, the chuck 503 is lowered and the substrate 583 can be removed through an opening 511.

The system allows the substrates to have temperature uniformity through reliable real-time, multi-point temperature measurements in a closed-loop temperature control. The control portion is implemented in a computer program executed on a programmable computer having a processor, a data storage system, volatile and non-volatile memory and/or storage elements, at least one input device, and at least one output device.

Each computer program is tangibly stored in a machine-readable storage medium or device (e.g., program memory or readable disk) readable by a general or special purpose programmable computer, for configuring and controlling operation of a computer when the storage media or device is read by the computer to perform the processes described herein. The invention may also be considered to be embodied in a computer-readable storage medium, configured with a computer program, where the storage medium so configured causes a computer to operate in a specific and predefined manner to perform the functions described herein.

The results of one experimental run are discussed next. First, an exemplary process recipe for depositing titanium nitride is detailed below:

| Process | step | time | function | Pressue (T) | carrier | liquid | $N_2$ | plasma | $H_2$ | chuck |
|---|---|---|---|---|---|---|---|---|---|---|
| Pre-clean | 1 | 4 s | Pump | 0 | 0 | 0 | 0 | 0 | 0 | up |
| | 2 | 3 s | Strike | 0 | 0 | 0 | 5 | 1200 | 0 | up |
| | 3 | 15 s | Plasma | 0.4 | 100 | 0 | 5 | 1200 | 0 | up |
| deposition | 4 | 10 s | Stab | 1.5 | 100 | 10 | 0 | 0 | 0 | up |
| | 5 | 6 s | dep1 | 1.5 | 100 | 10 | 0 | 0 | 0 | up |
| | 6 | 3 s | Purge | 0 | 100 | 0 | 0 | 0 | 0 | up |
| | 7 | 3 s | Pump | 0 | 0 | 0 | 0 | 0 | 0 | up |
| | 8 | 3 s | Strike | 0 | 0 | 0 | 5 | 1200 | 0 | up |
| | 9 | 30 s | plasma1 | 0.4 | 100 | 0 | 5 | 1200 | 0 | up |
| | 10 | | loop to step 4 (stab) | | | | | | | |
| Cooling | 11 | 1 s | Plasma off | 0 | 100 | 0 | 0 | 0 | 0 | up |
| | 12 | 30 s | Cool | 0 | 100 | 0 | 0 | 0 | 0 | down |

Steps 1–3 relate to pre-cleaning of the substrate surface. In these steps, the chamber is brought to a low pressure by evacuation pumping for 4 seconds. Next, the plasma is struck for 3 seconds. The strike operation allows the plasma to be started at low pressure and then the plasma is turned on for 15 seconds at a higher pressure. The plasma is turned on at a pressure of 0.4 Torr to provide high pressure, high density plasma for isotropic surface conditioning.

After pre-cleaning, the flow and pressure is stabilized for 10 seconds. A first deposition step is performed for 6 seconds. The chamber is purged with carrier gas or an inert gas such as $N_2$ for 3 seconds, and the valve to the pump is open for 3 seconds to remove all liquid precursors and/or vapor residues in the chamber. A plasma strike operation is performed for 3 seconds, and plasma treatment for the first deposition is activated for 30 seconds at a pressure of 0.4 Torr. For each additional deposition, the process loops back to step 4. When the wafer deposition is complete, the plasma is turned off for one second and the substrate is optionally cooled down for 30 seconds before it is removed from the chamber. The timing of the steps are illustrative and can be varied from as low as a half a second to as high as five minutes, depending on the desired property of the film and the film quality, among others.

Figure 8:
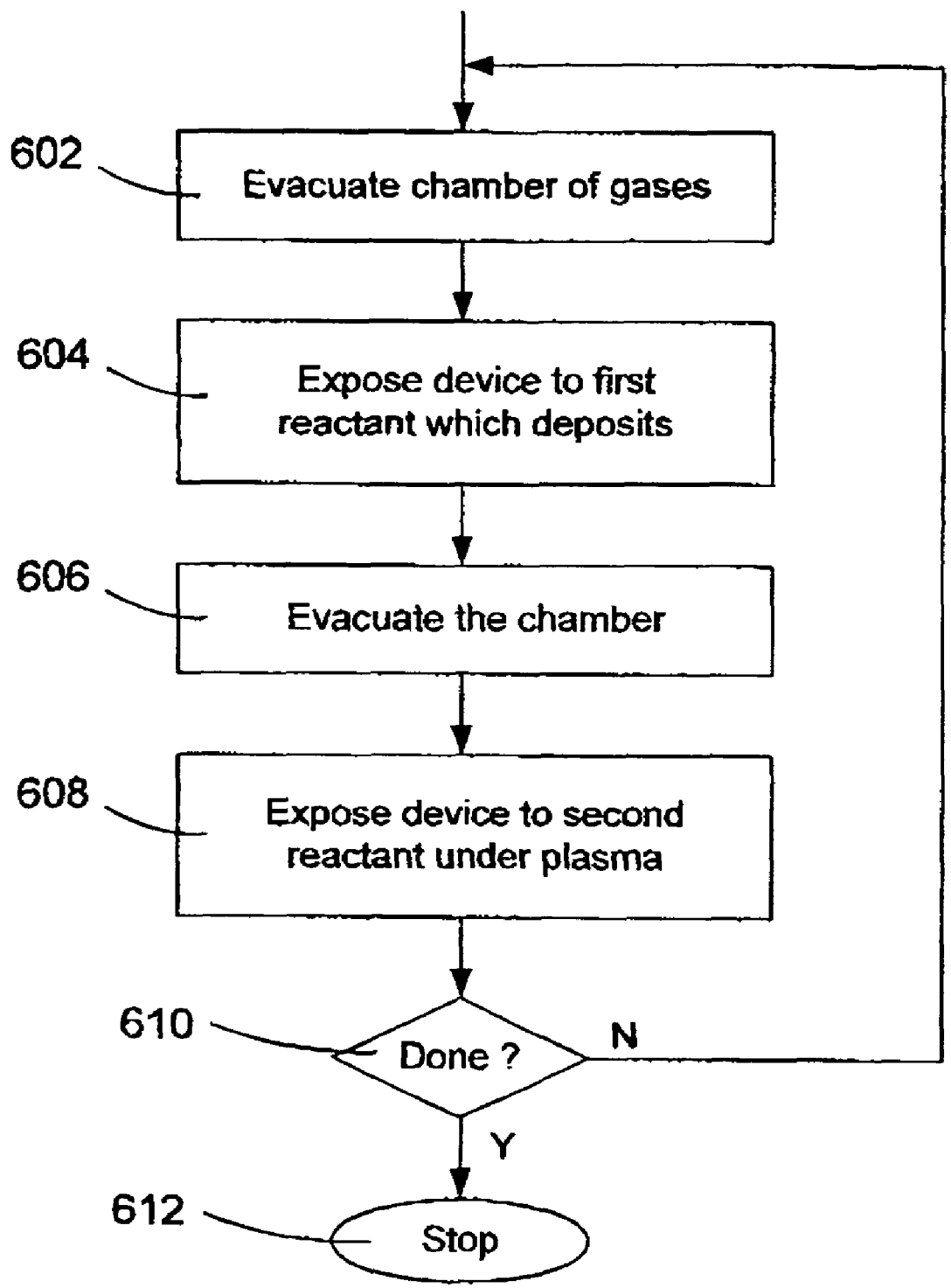
FIG. 8 shows a flow chart of a nanolayer thick film process in accordance with one embodiment of the invention.

FIG. 8 shows a flow chart of a nanolayer thick film process in accordance with one embodiment of the invention. NLD technique is a combination of ALD and CVD and thus makes use of the advantages of both ALD and CVD. The process of FIG. 8 includes evacuating a chamber of gases (step 602); exposing a device to a gaseous first reactant, wherein the first reactant deposits on the device to form the thin film (step 604); purging the chamber and evacuating the chamber of gases (step 606); and exposing the device, coated with the first reactant, to a gaseous second reactant under plasma, wherein the thin film deposited by the first reactant is treated to form the same materials or a different material (step 608). The process can be repeated if the decision to continue (step 610) is made. Alternatively, the process can be terminated (step 612).

In one embodiment of the process of FIG. 8, a first gas reactant is flowed over a wafer surface and deposits on the wafer. The amount of the first gas reactant into the chamber is controlled by a liquid flow controller ("LFC") and valves to control the deposition of a layer that is more than a monolayer thick to a few nanometers thick. The first reactant can then be purged with inert gas, and pumped. A second reactant is flowed into the chamber to react with the first reactant to form a layer that is more than a monolayer thick to a few nanometers thick. A high density plasma may be used during the second reactant injection to enhance or maintain the conformality of the deposited film on complex topography. The density of the deposited film may also increase after the high density plasma treatment during the second reactant injection. The second reactant then is optionally purged and removed by pumping. Other reactants can be flown in to react with deposited and reacted film to form a final film. The above steps are repeated to form a thick film that is a multiple in thickness of the layer that is more than a monolayer thick to a few nanometer thick. The thickness of each repeat or cycle deposited thus is more than a monolayer thick, but the subsequent reactants under high density plasma can still react with the full thickness of the deposited film to achieve a high quality and uniform film.

For the above NLD process, the materials deposit on the wafer in the deposition temperature regime and not by adsorption. The temperature in some cases is higher than the temperature of the ALD process, but lower than that of the conventional CVD process and adequate for other semiconductor processes. Since the NLD process is a deposition process rather than a self-limiting surface adsorption reaction process, the deposition rate to achieve a thickness of more than a monolayer to a few nanometers is controlled by an LFC and valves. The deposition rate in NLD process can also be controlled by tailoring the wafer temperature or chuck (or susceptor) temperature, process pressure, and gas flow rate, among others.

The process of deposition of nanolayer thick film provides almost completely conformal deposition on complex topography as that in semiconductor devices having 0.1 micron width with an aspect ratio of more than 8:1. Excellent conformality of film is achieved with NLD similar to that of ALD, and far superior than conformality of thick CVD film.

Where a film of a few to 10 nanometers thick is required, the NLD process provides higher throughput, since in each NLD cycle, a film of more than a monolayer to a few nanometers thick film is deposited. Since the NLD process has high throughput, the minimal volume constraint as in the ALD process is not necessary, and a conventional CVD chamber can be used to achieve highly conformal, high quality, high throughput films.

Since a film of more than a monolayer to a few nanometers thick is deposited in each cycle, the microstructure of the resulting film can be of nanocrystalline structure in an amorphous matrix, which can be ideal for certain applications, such as diffusion barrier for copper.

Since NLD is a deposition process, the precursors or gases are not limited to only those that deposit by a self-limiting surface reaction. NLD thus is not limited to ALD precursors and can be used to deposit a vast number of film materials from currently available precursors.

Figure 9:
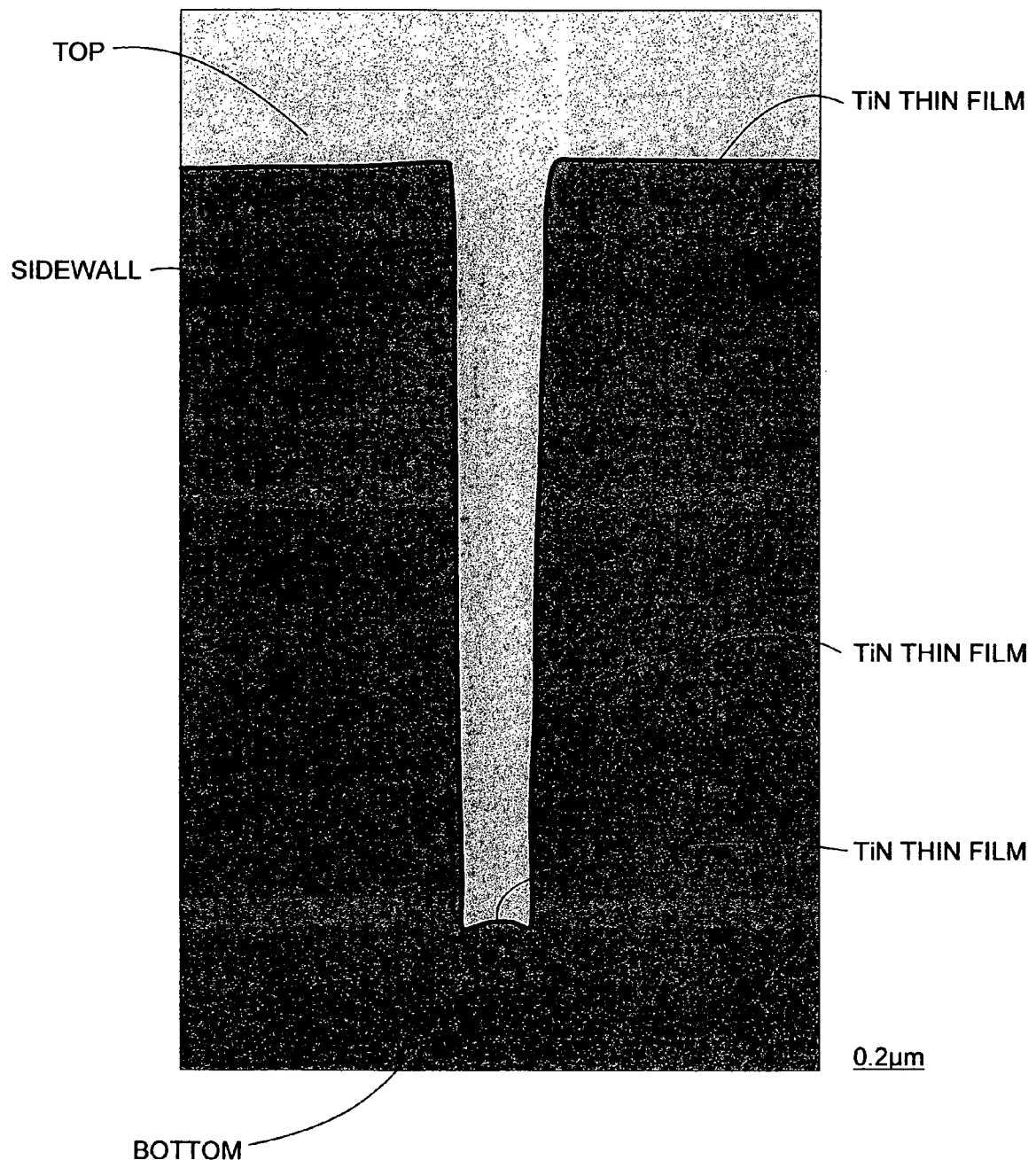
FIG. 9 shows an SEM of an exemplary wafer created in accordance with one embodiment of the invention.

FIG. 9 shows a Transmission Electron Micrograph ("TEM") of a structure that is deposited with a thin film in accordance with the steps discussed above. The structure has a height of approximately 800 nm, and an average width of approximately 90 nm. The aspect ratio of the structure is thus more than 8:1. Also seen in the Figure is 9 nm thin film of TiN that is deposited film in accordance with the steps discussed above onto the structure from the top. As shown therein, the thickness of the deposited film is approximately the same on top, on the sidewalls, and on the bottom of the structure, within the measurement approximation. Close examination of the micrograph indicates that the conformality of the deposited film is close to 100%. In comparison, conventional deposition methods using low density plasma—capacitance-coupled plasma typically results in a directional, non-isotropic bombardment of plasma treatment, resulting in non-treatment of the sidewalls.

Figure 10:
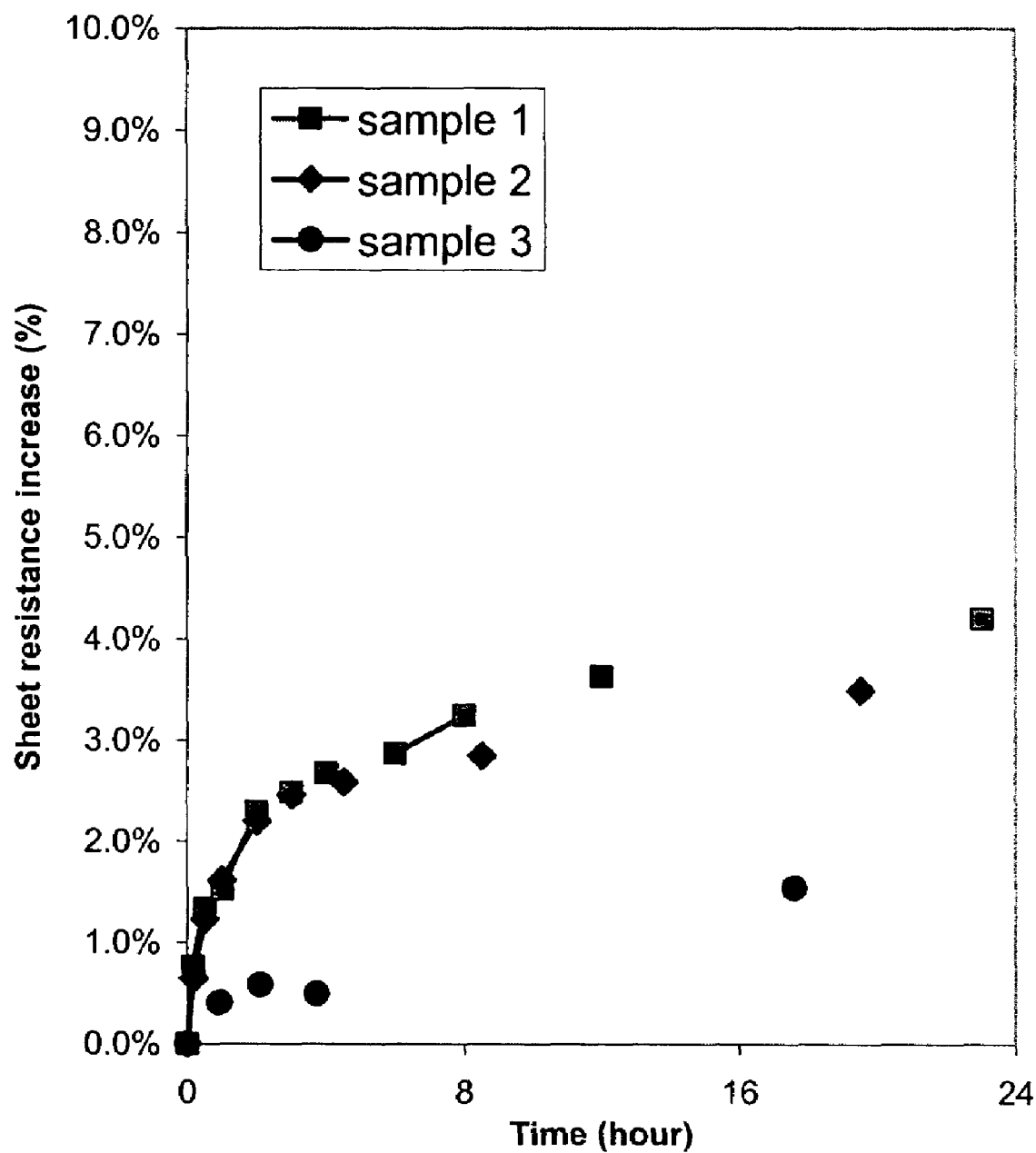
FIG. 10 shows a plot of film resistance increase as a function of time for an exemplary process recipe.

FIG. 10 shows a plot of film resistance increase of the titanium nitride ("TiN") thin films as a function of time for the above process. The demonstrated TiN film was deposited using TDMAT precursor and $N_2$ flow under plasma treatment in accordance with the steps discussed above. The wafer temperature during deposition was approximately 325° C. The resistivity of the bulk film is approximately 300 μOhm-cm. As shown therein, the sheet resistance increases approximately 4.2% for sample 1, which has a thickness of approximately 10 nm, approximately 3.5% for sample 2, which has a thickness of approximately 20 nm, and less than 2% for sample 3, which has a thickness of approximately 60 nm, over a period of approximately twenty four hours. The plot shows that the film is stable with minor resistance fluctuations. The increase in resistance in these TiN films deposited with a thin film following the steps disclosed above is significantly lower than reported values. K.C. Park et al. reported a 100 nm thick TiN film deposited using TDMAT precursor in an $N_2$ ion-beam-induced plasma CVD system increases almost 10% in resistivity after 24-hour air exposure. The conformality of the films also degrades to below 5%, in contrast to almost 100% conformality achieved with the film deposited in accordance with the steps discussed above. The advantage of using TDMAT precursor for TiN deposition is the lower deposition temperature compared to other precursors such as $TiCl_4$ and $NH_3$ which require a deposition temperature of higher than 600 degrees Celsius for good quality TiN film. Thermal TDMAT and TDEAT process produce highly conformal TiN films but with high carbon contamination, high resistivity of more than 2000 μOhm-cm, and unstable after air-exposure. Reactions of these films with $NH_3$ in various plasma reduce the impurities and resistivity; the conformality, however, is also degraded. Nitrogen plasma treatments also have been studied with TDMAT precursor. In general, however, conventional deposition methods using low density plasma—capacitance coupled plasma in down-stream or parallel plate configuration typically result in a directional, non-isotropic bombardment of plasma treatment, resulting in non-treatment of the sidewalls. More details on TiN deposition using different precursors and plasma treatments are discussed in K. C. Park et al., the content of which is incorporated by reference.

It should be realized that the above examples represent a few of a virtually unlimited number of applications of the plasma processing techniques embodied within the scope of the present invention. Furthermore, although the invention has been described with reference to the above specific embodiments, this description is not to be construed in a limiting sense. For example, the duty ratio, cycle time and other parameters and conditions may be changed to obtain desired wafer characteristics.

Various modifications of the disclosed embodiment, as well as alternative embodiments of the invention, will become apparent to persons skilled in the art upon reference to the above description. The invention, however, is not limited to the embodiment depicted and described. For instance, the radiation source can be a radio frequency heater rather than a lamp. Hence, the scope of the invention is defined by the claims that follow. It is further contemplated that the claims will cover such modifications that fall within the true scope of the invention.

What is claimed is:

1. A process to deposit a thin film on a device by chemical vapor deposition, comprising:
   a. exposing the device to a gaseous first reactant, wherein the first reactant deposits on the device to form a first layer that can be other than a monolayer;
   b. performing a plasma treatment on the deposited film;
   c. exposing the device, with the first layer deposited, to a gaseous second reactant under the plasma treatment to deposit a second layer; and
   d. repeating steps (a) through (c) until the thin film, comprising a plurality of layers, is deposited.

2. The process of claim 1, wherein the device is a wafer.

3. The process of claim 1, wherein the plasma treatment is capable of at least one of enhancing and maintaining at least one of conformality and density of the thin film.

4. The process of claim 1, wherein the plasma is a high density plasma with greater than $5 \times 10^9$ ion/cm3.

5. The process of claim 1, wherein at least one of the gaseous first reactant and the gaseous second reactant comprises a metal organic reactant.

6. The process of claim 1, wherein one of the reactants comprises an organic reactant.

7. The process of claim 1, wherein the thin film comprises a metal film.

8. The process of claim 1, wherein the thin film is selected from the group consisting of a metal nitride film and a metal oxide film.

9. The process of claim 1, wherein exposing the device, with the first layer deposited, to the second reactant occurs under pressure above one hundred militorr (100 mT).

10. The process of claim 1, further comprising pressurizing the chamber to a pressure above one hundred militorr (100 mT).

11. The process of claim 10, wherein reacting the first reactant and second reactant creates a new compound.

12. The process of claim 1, wherein the thin film thickness is between a fraction of a nanometer and ten nanometers.

13. The process of claim 1 further comprising exciting the plasma with a solid state RF plasma source.

14. The process of claim 13 wherein the process further comprises using a helical ribbon electrode as the solid state RF plasma source.

15. The process of claim 1, further comprising sequentially pulsing the plasma for each layer to be deposited.

16. The process of claim 1, further comprising purging a chamber of the first reactant.

17. A process to deposit a thin film by chemical vapor deposition, comprising:
   (a) pre-cleaning a surface of a device;
   (b) evacuating a chamber of gases;
   (c) exposing the device to a gaseous first reactant in the chamber, wherein the first reactant deposits on the device to form a layer having a thickness of other than a monolayer;
   (d) evacuating the chamber of gases;
   (e) striking a plasma;
   (f) exposing the device, coated with the first reactant, to a gaseous second reactant under the plasma so that the layer deposited by the first reactant is treated; and
   (g) repeating steps (c)–(f) until the thin film comprising a plurality of layers is deposited.

18. A process to deposit a thin film including a plurality of layers on a device by chemical vapor deposition, the process comprising:
   a. exposing the device to a gaseous first reactant, wherein the first reactant deposits on the device to form a layer;
   b. exposing the device, coated with the first reactant, to a gaseous second reactant under a plasma treatment, wherein the plasma treatment is generated with a solid state RF plasma source having a helical ribbon electrode, and wherein the layer deposited by the first reactant is treated; and
   c. repeating steps (a)–(b) until the thin film comprising a plurality of layers is deposited.

19. A method for processing a thin film onto a semiconductor wafer, the method comprising:
   exposing a wafer in a chamber with a first gaseous reactant;
   coating the wafer with the first reactant so that a first coat of the first reactant is greater than one monolayer in thickness;
   evacuating the chamber;
   exposing the coated wafer to a gaseous second reactant as a plasma; and
   forming a second coat over the first coat, the second coat being greater than one monolayer in thickness.

20. The method as in claim 19 wherein the method further comprises successively adding at least one additional coat by repeating the evacuating step, the second exposing step, and the forming step.

21. The method as in claim 20 wherein the method is unaffected by self-limiting surface reactions of the first coat, the second coat, and the at least one additional coat.

22. The method as in claim 19 wherein the method further comprises exciting the plasma with a solid state RF plasma source functionally associated with the chamber.

23. The method as in claim 19 wherein the exciting step uses a helical ribbon electrode, as the solid state RF plasma source.

24. The method as in claim 19, wherein the plasma has a density higher than $5 \times 10^9$ ion/cm3.

25. The method as in claim 19 wherein the method further comprises performing the second exposing step under pressure above 100 mT.

26. The method as in claim 19 wherein the second exposing step and subsequent forming step further comprise reacting the first coat of the first reactant with the second coat of the second reactant to form a different chemical product.

27. The method as in claim 19 wherein the method is unaffected by self-limiting surface reactions of the first coat and second coat.

* * * * *